US010625758B2

(12) United States Patent
Sato et al.

(10) Patent No.: US 10,625,758 B2
(45) Date of Patent: Apr. 21, 2020

(54) RAILROAD VEHICLE, VOLTAGE ESTIMATING DEVICE FOR POWER SUPPLY LINE, AND METHOD FOR ESTIMATING VOLTAGE OF POWER SUPPLY LINE

(71) Applicant: Central Japan Railway Company, Aichi (JP)

(72) Inventors: Kenji Sato, Aichi (JP); Takafumi Fukushima, Aichi (JP); Norihiro Suyama, Aichi (JP)

(73) Assignee: CENTRAL JAPAN RAILWAY COMPANY, Aichi (JP)

( * ) Notice: Subject to any disclaimer, the term of this patent is extended or adjusted under 35 U.S.C. 154(b) by 261 days.

(21) Appl. No.: 15/883,827

(22) Filed: Jan. 30, 2018

(65) Prior Publication Data

US 2018/0222501 A1    Aug. 9, 2018

(30) Foreign Application Priority Data

Jan. 31, 2017   (JP) .................................. 2017-015485

(51) Int. Cl.
*B61L 3/00* (2006.01)
*B60L 9/00* (2019.01)
(Continued)

(52) U.S. Cl.
CPC ................. *B61L 3/006* (2013.01); *B60L 9/00* (2013.01); *B60L 9/28* (2013.01); *B61C 3/00* (2013.01);
(Continued)

(58) Field of Classification Search
CPC ... B61L 3/006; G01R 19/0084; G01R 31/008; G01R 19/2513; G01R 15/18;
(Continued)

(56) References Cited

U.S. PATENT DOCUMENTS

2010/0079093 A1* 4/2010 Kitanaka ................. B60L 3/003
                                              318/400.3
2012/0000739 A1* 1/2012 Nogi ......................... B60L 9/08
                                              191/50
(Continued)

FOREIGN PATENT DOCUMENTS

JP          4568111 B2    10/2010

*Primary Examiner* — Rexford N Barnie
*Assistant Examiner* — Terrence R Willoughby
(74) *Attorney, Agent, or Firm* — David D. Brush; Westman, Champlin & Koehler, P.A.

(57) ABSTRACT

A voltage estimating device for a power supply line according to one aspect of the present disclosure includes a voltage detector, a current detector, a voltage calculator. The voltage calculator calculates a magnitude of alternating primary voltage that a primary winding in a transformer receives from a power supply line based on a magnitude of tertiary voltage in the transformer detected by the voltage detector, a magnitude of output current in the transformer detected by the current detector, and correlation information. The correlation information indicates a correlation between a voltage ratio and the magnitude of the output current, and the voltage ratio represents a ratio of the magnitude of the primary voltage to the magnitude of the tertiary voltage.

12 Claims, 4 Drawing Sheets

(51) Int. Cl.
  *G01R 15/18*  (2006.01)
  *G01R 19/25*  (2006.01)
  *H01F 38/14*  (2006.01)
  *B61C 3/00*   (2006.01)
  *G01R 19/00*  (2006.01)
  *H01F 27/40*  (2006.01)
  *B60L 9/28*   (2006.01)
  *G01R 31/00*  (2006.01)
  *H02P 27/08*  (2006.01)
  *H01F 27/42*  (2006.01)

(52) U.S. Cl.
  CPC ......... *G01R 15/18* (2013.01); *G01R 19/0084* (2013.01); *G01R 19/2513* (2013.01); *G01R 31/008* (2013.01); *H01F 27/40* (2013.01); *H01F 38/14* (2013.01); *B60L 2200/26* (2013.01); *B60L 2210/00* (2013.01); *B60L 2210/30* (2013.01); *B60L 2240/527* (2013.01); *B60L 2240/529* (2013.01); *H01F 27/42* (2013.01); *H02P 27/08* (2013.01)

(58) Field of Classification Search
  CPC .......... H01F 27/40; H01F 38/14; H01F 27/42; B60L 9/28; B60L 9/00; B60L 2240/527; B60L 2210/30; B60L 2240/529; B60L 2200/26; B60L 2210/00; B61C 3/00; H02P 27/08
  See application file for complete search history.

(56) References Cited

U.S. PATENT DOCUMENTS

2017/0158057 A1\* 6/2017 Otani ................. B60L 3/00
2019/0135117 A1\* 5/2019 Kunomura ............. H02M 1/00

\* cited by examiner

RAILROAD VEHICLE, VOLTAGE ESTIMATING DEVICE FOR POWER SUPPLY LINE, AND METHOD FOR ESTIMATING VOLTAGE OF POWER SUPPLY LINE

CROSS-REFERENCE TO RELATED APPLICATIONS

The present application claims the benefit of Japanese Patent Application No. 2017-015485 filed on Jan. 31, 2017 with the Japan Patent Office, the entire disclosure of the Japanese Patent Application No. 2017-015485 is incorporated herein by reference.

BACKGROUND

The present disclosure relates to a technique to estimate the magnitude of the voltage in a power supply line.

Railroad vehicles configured to receive alternating-current power from power supply lines (for example, overhead lines) and to be operated by the alternating-current power are known. This type of railroad vehicle includes a transformer and a power converter. The transformer receives alternating-current primary voltage from a power supply line and converts the primary voltage into secondary voltage and tertiary voltage. The secondary voltage is inputted into the power converter that generates electric power that drives a motor. The tertiary voltage is inputted into a load that is different from the power converter.

Obtaining a voltage value in a power supply line and performing various controls based on the voltage value in a railroad vehicle traveling configured as described above has been considered.

The publication of the Japanese Patent No. 4568111 discloses a power converter configured to detect a voltage value in an alternating-current bus and to control electric power to be supplied to a load based on the voltage value.

SUMMARY

To detect a voltage value in a power supply line in a railroad vehicle while the railroad vehicle is traveling, a method is conceivable in which, for example, a tertiary voltage value in a transformer is detected, and the voltage value in the power supply line is calculated by multiplying the detected tertiary voltage value by the ratio of the winding turns of a primary winding to the winding turns of a tertiary winding in the transformer.

However, due to a so-called regulation phenomenon caused in the transformer, the ratio of the voltage value of the power supply line to the tertiary voltage value does not always correspond to the winding turns ratio of the winding turns of the primary winding to the winding turns of the tertiary winding.

One of the regulation phenomena is fluctuations in the tertiary voltage value caused by fluctuation in a secondary load to which the secondary voltage is applied. A transformer that is installed in a railroad vehicle and comprises a secondary winding and a tertiary winding is usually configured such that the secondary winding and the tertiary winding are magnetically coupled. Accordingly, in this transformer, mutual induction takes place between the secondary winding and the tertiary winding. When the secondary load fluctuates and the secondary current flowing in the secondary winding fluctuates, the tertiary voltage also fluctuates due to the mutual induction. In a railroad vehicle, the secondary current tends to greatly fluctuate particularly during power running or braking. In response to the large fluctuations in the secondary current, the tertiary voltage may also greatly fluctuate.

Thus, obtaining an accurate voltage value is difficult in the method in which a voltage value of a power supply line is calculated based on a detected tertiary voltage value and the winding turns ratio as described above.

It is preferable that one aspect of the present disclosure can provide a technique in which the magnitude of the voltage in a power supply line can be estimated with high accuracy.

A railroad vehicle according to one aspect of the present disclosure comprises an assembly, a power converter, a voltage detector, a current detector, and a voltage calculator.

The assembly comprises a railroad truck, and a vehicle body. The railroad truck is configured to rotatably hold an axle. The vehicle body is provided to the railroad truck.

The power converter is provided to the assembly. The power converter is configured to generate electric power that drives a motor based on output power from a transformer. The transformer comprises a primary winding, a secondary winding, and a tertiary winding. The primary winding is configured to receive alternating primary voltage from a power supply line. The secondary winding is electromagnetically coupled to the primary winding and configured to output the output power. The output power includes secondary voltage that is lower than the primary voltage and output current. The tertiary winding is electromagnetically coupled to the primary winding and configured to output tertiary voltage that is lower than the secondary voltage.

The voltage detector is provided to the assembly and configured to detect a magnitude of the tertiary voltage.

The current detector is provided to the assembly and configured to detect a magnitude of the output current.

The voltage calculator is provided to the assembly. The voltage calculator is configured to calculate a magnitude of the primary voltage based on the magnitude of the tertiary voltage detected by the voltage detector, the magnitude of the output current detected by the current detector, and correlation information. The correlation information indicates a correlation between a voltage ratio and the magnitude of the output current. The voltage ratio represents a ratio of the magnitude of the primary voltage to the magnitude of the tertiary voltage.

A voltage estimating device for a power supply line according to another aspect of the present disclosure comprises a voltage detector, a current detector, and a voltage calculator.

The voltage detector is configured to detect a magnitude of specified voltage outputted from a transformer provided to a railroad vehicle. The transformer comprises a primary winding, a secondary winding, and a tertiary winding. The primary winding is configured to receive alternating primary voltage from a power supply line. The secondary winding is electromagnetically coupled to the primary winding and configured to output secondary voltage that is lower than the primary voltage and output current. The tertiary winding is electromagnetically coupled to the primary winding and configured to output tertiary voltage that is lower than the secondary voltage. The specified voltage corresponds to the tertiary voltage.

The current detector is configured to detect a magnitude of the output current.

The voltage calculator is configured to calculate a magnitude of the primary voltage based on the magnitude of the tertiary voltage detected by the voltage detector, the magnitude of the output current detected by the current detector, and correlation information. The correlation information indicates a correlation between a voltage ratio and the magnitude of the output current. The voltage ratio represents a ratio of the magnitude of the primary voltage to the magnitude of the tertiary voltage.

In the voltage estimating device for a power supply line configured as described above, the magnitude of the tertiary voltage and the magnitude of the output current are detected. Based on the detected magnitude of the tertiary voltage, the detected magnitude of the output current, and the correlation information, the magnitude of the primary voltage (that is, the magnitude of the voltage in the power supply line) is calculated.

Even if the magnitude of the tertiary voltage fluctuates in response to the fluctuations in the magnitude of the output current, the magnitude of the primary voltage is highly accurately calculated based on the correlation. Thus, from the detected magnitude of the tertiary voltage, the magnitude of the voltage in the power supply line can be estimated with high accuracy.

The correlation information may include a linear function. The linear function may represent a linear relation between the voltage ratio and the magnitude of the output current. The voltage calculator may be configured to calculate the magnitude of the primary voltage based on the linear function.

In the voltage estimating device for a power supply line configured as described above, based on the magnitude of the tertiary voltage, the magnitude of the output current, and the linear function, the magnitude of the voltage in the power supply line is calculated. Accordingly, from the detected magnitude of the tertiary voltage, the magnitude of the voltage in the power supply line can be easily estimated with high accuracy.

The linear relation may be linearly approximated based on the magnitude of the primary voltage, the magnitude of the tertiary voltage, and the magnitude of the output current. The magnitude of the primary voltage, the magnitude of the tertiary voltage, and the magnitude of the output current may be experimentally measured. For example, in a traveling railroad vehicle, the magnitude of the voltage in the power supply line, the magnitude of the tertiary voltage, and the magnitude of the output current may be experimentally measured (actually measured). Based on the measurement result, the linear function may be derived by linearly approximating the relation between the voltage ratio and the magnitude of the output current.

With the linear function derived based on the measurement result, the magnitude of the voltage in the power supply line can be more highly accurately estimated.

The tertiary voltage may be inputted into a first load configured to operate by the tertiary voltage. The magnitude of the primary voltage, the magnitude of the tertiary voltage, and the magnitude of the output current may be experimentally measured under a condition where a state of the first load is maintained constant.

The voltage estimating device for a power supply line configured as described above, the magnitude of the voltage in the power supply line can be estimated based on the linear function in which the relation between the voltage ratio and the magnitude of the output current is properly reflected.

The voltage estimating device for a power supply line may further comprise a secondary voltage calculator. The secondary voltage calculator may calculate a magnitude of the secondary voltage from the magnitude of the primary voltage calculated by the voltage calculator based on a ratio of winding turns of the primary winding to winding turns of the secondary winding.

In the voltage estimating device for a power supply line configured as described above, the magnitude of the secondary voltage can be easily obtained by numerical calculation from the highly accurate magnitude of the primary voltage calculated by the voltage calculator.

The secondary voltage may be inputted into a second load configured to operate by the secondary voltage. The voltage estimating device for a power supply line may further comprise a power calculator. The power calculator may calculate power consumption by the second load based on the magnitude of the secondary voltage calculated by the secondary voltage calculator and the magnitude of the output current detected by the current detector.

In the voltage estimating device for a power supply line configured as described above, the power consumption by the second load can be easily and accurately calculated.

The voltage estimating device for a power supply line may be configured to be installed in a railroad vehicle.

The voltage estimating device for a power supply line may be configured to be installed in a train comprising at least one railroad vehicle. The train may comprise the transformer.

The voltage estimating device for a power supply line may be configured to be installed in a power converter. The power converter may be configured to be installed in the train. The power converter may be configured, upon receiving output power including the secondary voltage and the output current from the transformer, to generate, from the output power, electric power that drives a motor based on the magnitude of the primary voltage calculated by the voltage calculator. The motor may be configured to generate driving force that operates the train.

In the power converter in which the voltage estimating device for a power supply line configured as described above is installed, a control method based on the magnitude of the voltage in the power supply line can be easily employed, and, using the control method, electric power to be supplied to the motor can be generated.

The voltage estimating device for a power supply line may further comprise a storage that stores the correlation information. The voltage calculator may be configured to calculate a magnitude of the primary voltage based on the correlation information stored in the storage.

Still another aspect of the present disclosure is a method for estimating voltage in a power supply line, the method comprising:

detecting a magnitude of specified voltage outputted from a transformer provided to a railroad vehicle, the transformer comprising a primary winding, a secondary winding, and a tertiary winding, the primary winding being configured to receive alternating primary voltage from a power supply line, the secondary winding being electromagnetically coupled to the primary winding and configured to output secondary voltage that is lower than the primary voltage and output current, the tertiary winding being electromagnetically coupled to the primary winding and configured to output tertiary voltage that is lower than the secondary voltage, and the specified voltage corresponding to the tertiary voltage, detecting a magnitude of the output current, and calculating a magnitude of the primary voltage based on the magnitude of the tertiary voltage detected, the magnitude of the output current detected, and correlation information, the correlation information indicating a correlation between a voltage ratio and the magnitude of the output current, the voltage ratio representing a ratio of the magnitude of the primary voltage to the magnitude of the tertiary voltage.

BRIEF DESCRIPTION OF THE DRAWINGS

Hereinafter, an example embodiment of the present disclosure will be described with reference to the accompany drawings in which.

DETAILED DESCRIPTION OF THE PREFERRED EMBODIMENTS

1. Embodiment (1-1) Overview of Railroad Vehicle

Figure 1:
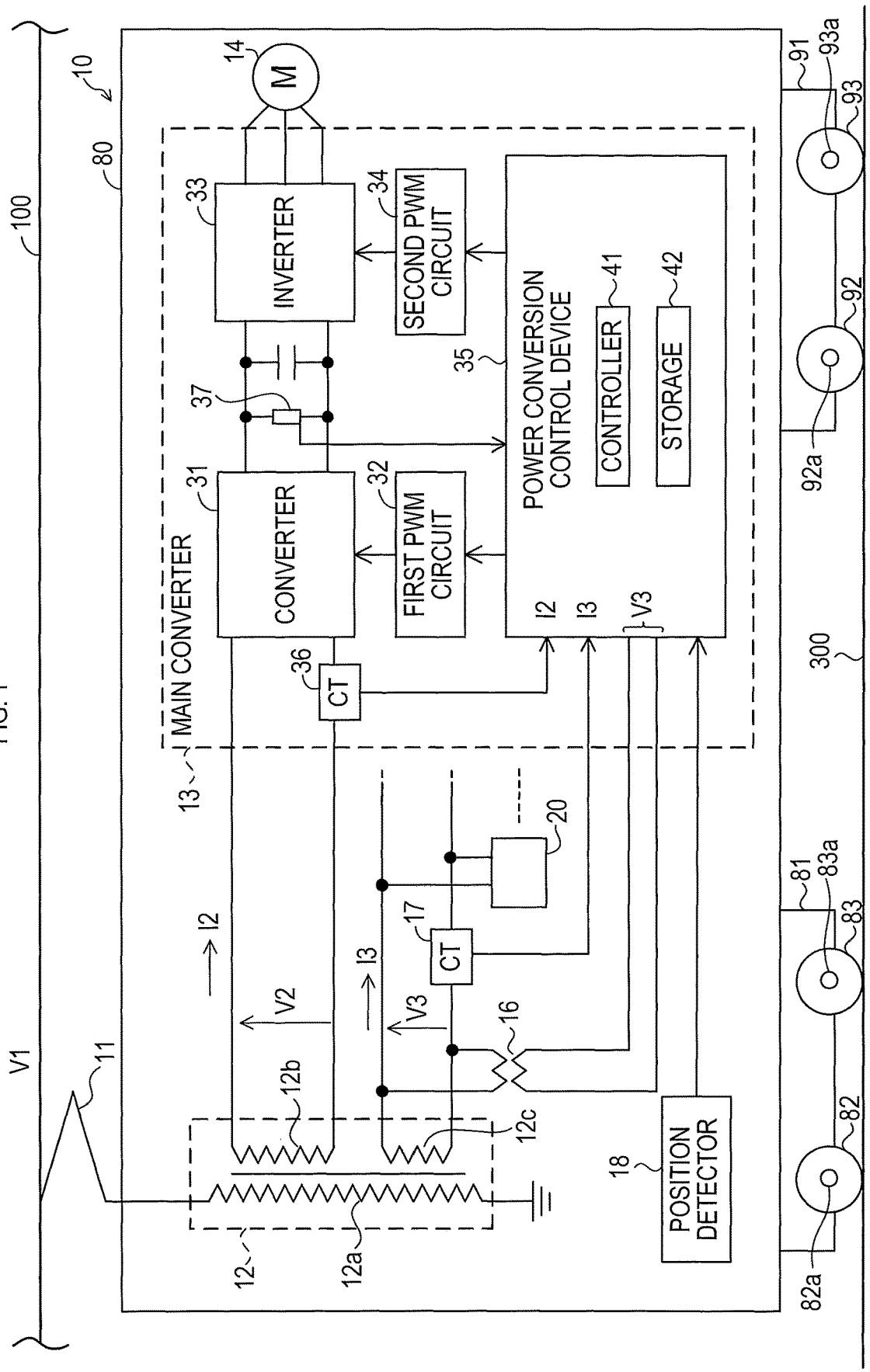
FIG. 1 is an explanatory diagram showing a configuration of a railroad vehicle according to an embodiment.

A railroad vehicle 10 according to the present embodiment shown in FIG. 1 is configured to receive alternating-current power from a power supply line 100. The power supply line 100 is coupled to a feeding circuit, which is not shown in the drawing, and the alternating-current power is supplied from the feeding circuit. The power supply line 100 of the present embodiment comprises, for example, an overhead line. The overhead line is disposed over the railroad vehicle 10 in a position higher than that of the roof of the railroad vehicle 10 along a track 300 (for example, a railroad track) configured for the railroad vehicle 10 to run thereon. In another embodiment, the railroad vehicle 10 may be configured to receive alternating-current power from, for example, a power supply line that is laid on the ground and is different from the overhead line 100. In other words, the power supply line 100 may be disposed in any place by any manner.

The railroad vehicle 10 comprises, as shown in FIG. 1, a vehicle body 80 and railroad trucks 81, 91. The railroad truck 81 rotatably holds axles 82a, 83a. Wheels 82 are attached to the axle 82a, and wheels 83 are attached to the axle 83a. The railroad truck 91 is configured in the same manner as the railroad truck 81. That is, the railroad truck 91 rotatably holds axles 92a, 93a. Wheels 92 are attached to the axle 92a, and wheels 93 are attached to the axle 93a.

The vehicle body 80 is disposed on the railroad trucks 81, 91. The vehicle body 80 comprises a pantograph 11, a main transformer 12, a main converter 13, a motor 14, a tertiary voltage detector 16, a tertiary current detector 17, a position detector 18, and a tertiary load 20. These components provided to the vehicle body 80 may be disposed in any positions of the vehicle body 80. For example, the components may be disposed inside the vehicle body 80, or may be disposed outside the vehicle body 80 (for example, underfloor).

The pantograph 11 receives alternating-current power from the power supply line 100. The alternating-current voltage applied to the power supply line 100 may be, for example, 25 kV in the present embodiment.

The main transformer 12 lowers the voltage of an alternating-current primary voltage (that is, the alternating-current voltage applied to the power supply line 100) inputted from the pantograph 11 to a secondary voltage that is lower than the primary voltage and to a tertiary voltage that is lower than the secondary voltage and outputs the secondary voltage and the tertiary voltage. The secondary voltage outputted from the main transformer 12 is inputted into the main converter 13. The tertiary voltage outputted from the main transformer 12 is inputted into the tertiary load 20.

The main transformer 12 comprises a primary winding 12a, a secondary winding 12b, and a tertiary winding 12c. The primary winding 12a receives the primary voltage from the pantograph 11. The secondary winding 12b is electromagnetically coupled to the primary winding 12a and outputs the secondary voltage and a secondary current. The tertiary winding 12c is electromagnetically coupled to the primary winding 12a and outputs the tertiary voltage and a tertiary current.

The tertiary voltage detector 16 detects a tertiary voltage value V3 and outputs an electric signal according to the tertiary voltage value V3 (hereinafter referred to as a "tertiary voltage detection signal") to the main converter 13.

The tertiary current detector 17 detects a tertiary current value I3 and outputs an electric signal according to the tertiary current value I3 (hereinafter referred to as a "tertiary current detection signal") to the main converter 13.

The tertiary voltage is inputted into the tertiary load 20, and the tertiary load 20 is operated by the tertiary voltage. Examples of the tertiary load 20 may include an air conditioner, a lighting apparatus, a door opening/closing apparatus, and a communication apparatus.

The position detector 18 detects the position of the traveling railroad vehicle 10 and outputs a position detection signal indicating the detected position to the main converter 13.

The main converter 13 converts the electric power inputted from the secondary winding 12b (corresponding to one example of the output power according to the present disclosure) into three-phase electric power that drives the motor 14. The three-phase electric power is supplied to the motor 14. The main converter 13 comprises a converter 31, a first PWM circuit 32, an inverter 33, a second PWM circuit 34, a power conversion control device 35, and a secondary current detector 36.

The converter 31 according to the present embodiment converts alternating-current secondary voltage inputted from the secondary winding 12b into direct-current voltage and outputs the direct-current voltage to the inverter 33. The inverter 33 converts the direct-current voltage inputted from the converter 31 into three-phase alternating-current voltages and outputs the three-phase alternating-current voltages to the motor 14. The inverter 33 according to the present embodiment may be so-called a VVVF inverter.

The motor 14 may be a three-phase induction motor in the present embodiment. The motor 14 according to the present embodiment is rotationally driven by three-phase alternating-current voltages supplied thereto. The motor 14 is configured to generate the driving force that operates the railroad vehicle 10. That is, when the motor 14 is rotationally driven, the rotational driving force is transmitted to wheels 82, 83, 92, 93, and thereby the railroad vehicle 10 is operated.

Between the converter 31 and the inverter 33, a converter voltage detector 37 is disposed. The converter voltage detector 37 detects a value of the direct-current voltage outputted from the converter 31 (hereinafter referred to as a "direct-current voltage value Vcon"). Specifically, the converter voltage detector 37 outputs a converter voltage detection signal according to the direct-current voltage value Vcon to the power conversion control device 35.

The secondary current detector 36 detects a secondary current value I2 and outputs an electric signal according to the secondary current value I2 (hereinafter referred to as a "secondary current detection signal").

The tertiary voltage detection signal, the tertiary current detection signal, the secondary current detection signal, and the position detection signal are inputted into the power conversion control device 35 in the main converter 13.

The power conversion control device 35 comprises a controller 41 and a storage 42. The controller 41 may comprise a CPU in the present embodiment. The storage 42 may comprise a semiconductor memory. The semiconductor memory may be, for example, a ROM, a RAM, an NVRAM, or a flash memory. An Example of the power conversion control device 35 in the present embodiment may comprise a microcomputer including a CPU and a semiconductor memory.

The controller 41 achieves various functions by executing various programs stored in a non-transitory tangible storage medium. In the present embodiment, the storage 42 may correspond to the non-transitory tangible storage medium that stores the various programs. The various programs stored in the storage 42 include programs for a voltage and power calculation process in FIG. 3, which will be described below.

A part of or the entire of the various functions may be implemented in the power conversion control device 35 by a hardware with a combination of, for example, a logic circuit and an analog circuit, instead of or in addition to a software.

More specifically, to install various functions, the power conversion control device 35 may comprise, instead of or in addition to a microcomputer, a combination of various types of individual electronic components, an Application Specified Integrated Circuit (ASIC), an Application Specific Standard Product (ASSP), a programmable logic device such as Field Programmable Gate Array (FPGA), or a combination of these devices.

The power conversion control device 35 obtains: the tertiary voltage value V3 based on the tertiary voltage detection signal; a tertiary current detection value I3 based on the tertiary current detection signal; the secondary current value I2 based on the secondary current detection signal; and the direct-current voltage value Vcon based on the converter voltage detection signal.

The power conversion control device 35 generates a command signal for driving the converter 31 based on the obtained tertiary voltage value V3, the obtained tertiary current detection value I3, the obtained secondary current value I2, and the obtained direct-current voltage value Vcon, and outputs the command signal to the first PWM circuit 32.

The power conversion control device 35 according to the present embodiment controls the converter 31 by, for example, unity power factor control or leading power factor control. The unity power factor control is a control method to be performed such that the reactive power inputted into the converter 31 becomes zero. The unity power factor control may be a control method in which the reactive power inputted from the pantograph 11 becomes zero. The leading power factor control is a control method to be performed such that the phase of the secondary current inputted into the converter 31 leads the phase of the secondary voltage. The leading power factor control may be a control method in which the phase of the current inputted from the pantograph 11 leads the phase of the primary voltage.

Although the power conversion control device 35 needs a primary voltage value V1 in order to control the converter 31, the railroad vehicle 10 according to the present embodiment does not comprise a detector that directly detects the primary voltage value V1. Alternatively, the power conversion control device 35 according to the present embodiment estimates (calculates) the primary voltage value V1 using the tertiary voltage value V3 and the secondary current value I2 inputted therein.

Using the estimated primary voltage value V1 and the direct-current voltage value Vcon, the power conversion control device 35 generates a command signal for controlling the converter 31.

According to the command signal inputted from the power conversion control device 35, the first PWM circuit 32 outputs a drive signal to the converter 31 so as to drive the converter 31. Specifically, the first PWM circuit 32 individually turns on or off switching elements, not shown, in the converter 31 in accordance with the command signals so as to drive the converter 31. As a result, a desired control such as the above-described unity power factor control or the leading phase control is achieved.

The power conversion control device 35 generates a control signal for controlling the inverter 33 and outputs the control signal to the second PWM circuit 34. According to the control signal inputted from the power conversion control device 35, the second PWM circuit 34 outputs a drive signal to the inverter 33 so as to drive the inverter 33.

(1-2) Method for Estimating Primary Voltage Value V1

The following describes a method for estimating the primary voltage value V1 in the power conversion control device 35.

The method to obtain the primary voltage value V1 from the tertiary voltage value V3 includes multiplying the tertiary voltage value V3 by a tertiary winding turns ratio a13. The tertiary winding turns ratio a13 is a ratio of the winding turns N1 of the primary winding 12a (hereinafter referred to as a "primary winding turns N1") to the winding turns N3 of the tertiary winding 12c (hereinafter referred to as a "tertiary winding turns N3").

However, the primary voltage value V1 obtained by this method may be a different value from the actual primary voltage value V1 because of the influence of fluctuations in the tertiary voltage value V3 caused by the regulation phenomenon.

Thus, the power conversion control device 35 according to the present embodiment estimates the primary voltage value V1 based on the tertiary voltage value V3 detected by the tertiary voltage detector 16 using a specific conversion formula in which the tertiary winding turns ratio a13 is not used.

As a result of various analyses, the inventors of the subject application have found out that the ratio of the primary voltage value V1 to the tertiary voltage value V3 (hereinafter referred to as a "V1/V3 ratio") is correlated to the secondary current value I2. Specifically, the inventors of the subject application have found out that the V1/V3 ratio can be represented by a function in which the secondary current value I2 is a variable, and that the function can be approximated to a linear function.

That is, the relation between the V1/V3 ratio and the secondary current value I2 can be represented by the following formulas (1) and (2).

$$V1(x)/V3(x)=f(I2) \tag{1}$$

$$f(I2)=A \cdot I2(x)+B \tag{2}$$

"X" represents a point, that is, the position where the railroad vehicle 10 traveling on the track 300 is located on the track 300. A and B are constants (for example, specific real numbers). Hereinafter, f(I2) will be referred to as a "conversion factor".

The primary voltage value V1(x) can be calculated using the conversion factor f(I2) derived in advance and the detected tertiary voltage value V3 by the following formula (3).

$$V1(x)=V3(x) \cdot f(I2) \tag{3}$$

Next, a method for deriving the conversion factor f(I2) will be described. The conversion factor f(I2) may be derived by actually measuring (that is, experimentally measuring) the primary voltage value V1, the tertiary voltage value V3, and the secondary current value I2 and analyzing the actually measured data. While the railroad vehicle 10 or a vehicle that is different from the railroad vehicle 10 is actually operated on the track 300, the primary voltage value V1, the tertiary voltage value V3, and the secondary current value I2 may be actually measured in the operated vehicle.

In order to derive the conversion factor f(I2), a measurement instrument and so on for actually measuring the primary voltage value V1 may be temporarily installed on a commercial vehicle and the primary voltage value V1 may be actually measured. For example, a measurement instrument that measures the primary voltage value V1 may be temporarily installed in the railroad vehicle 10, and the railroad vehicle 10 may be actually operated so as to actually measure and record the primary voltage value V1, the tertiary voltage value V3, and the secondary current value I2 at every different point x, while the railroad vehicle 10 is travelling. The point x may be obtained based on the position detection signal from the position detector 18.

Alternatively, the primary voltage value V1 may be actually measured at every different point x by a special test vehicle comprising various measuring, examining, and testing functional facilities including the function to measure the primary voltage value V1. Moreover, the test vehicle and the commercial vehicle may be operated, for example, in a close front-and-rear arrangement, and the primary voltage value V1 may be actually measured and recorded in the test vehicle, while the tertiary voltage value V3 and the secondary current value I2 may be actually measured and recorded in the commercial vehicle.

As one example, while the test vehicle and the commercial vehicle were operated in alignment across a specified traveling section, the aforementioned values V1(x), V3(x), I2(x) were individually actually measured at every different point x and recorded in the present embodiment. In the actual measurement, the state of different parts of the railroad vehicle 10 including the operating position of the notch, the velocity of the vehicle, the operational state of the tertiary load 20, and so on was set in a similar manner to the expected operational state of the railroad vehicle 10 during its actual commercial operation. In other words, the state of the actual commercial operation was reproduced in the railroad vehicle 10 and the actual measurement was performed.

Furthermore, while the aforementioned values V1(x), V3(x), I2(x) were actually measured, the secondary load was fluctuated. The secondary load is a load to which the secondary voltage is supplied from the main transformer 12 and includes the main converter 13 and the motor 14. In the present embodiment, while the aforementioned values V1(x), V3(x), I2(x) were actually measured, the secondary current value I2(x) was intentionally changed by, for example, varying the power consumption in the main converter 13. Specifically, for example, the secondary load was fluctuated by switching the level of the notch to different levels so that the secondary current values I2(x) actually measured would be distributed in a specified range of values.

On the other hand, while the aforementioned values V1(x), V3(x), I2(x) were actually measured, the state of the tertiary load 20 was maintained constant. That is, under the condition in which the state of the tertiary load 20 was maintained constant, in other words, the impedance from the tertiary winding 12c toward the tertiary load 20 on the whole was set constant, the aforementioned values V1(x), V3(x), I2(x) were actually measured. "Constant" mentioned here may include fluctuations within a range in which the conversion factor f(x) with desired accuracy can be derived.

Figure 2:
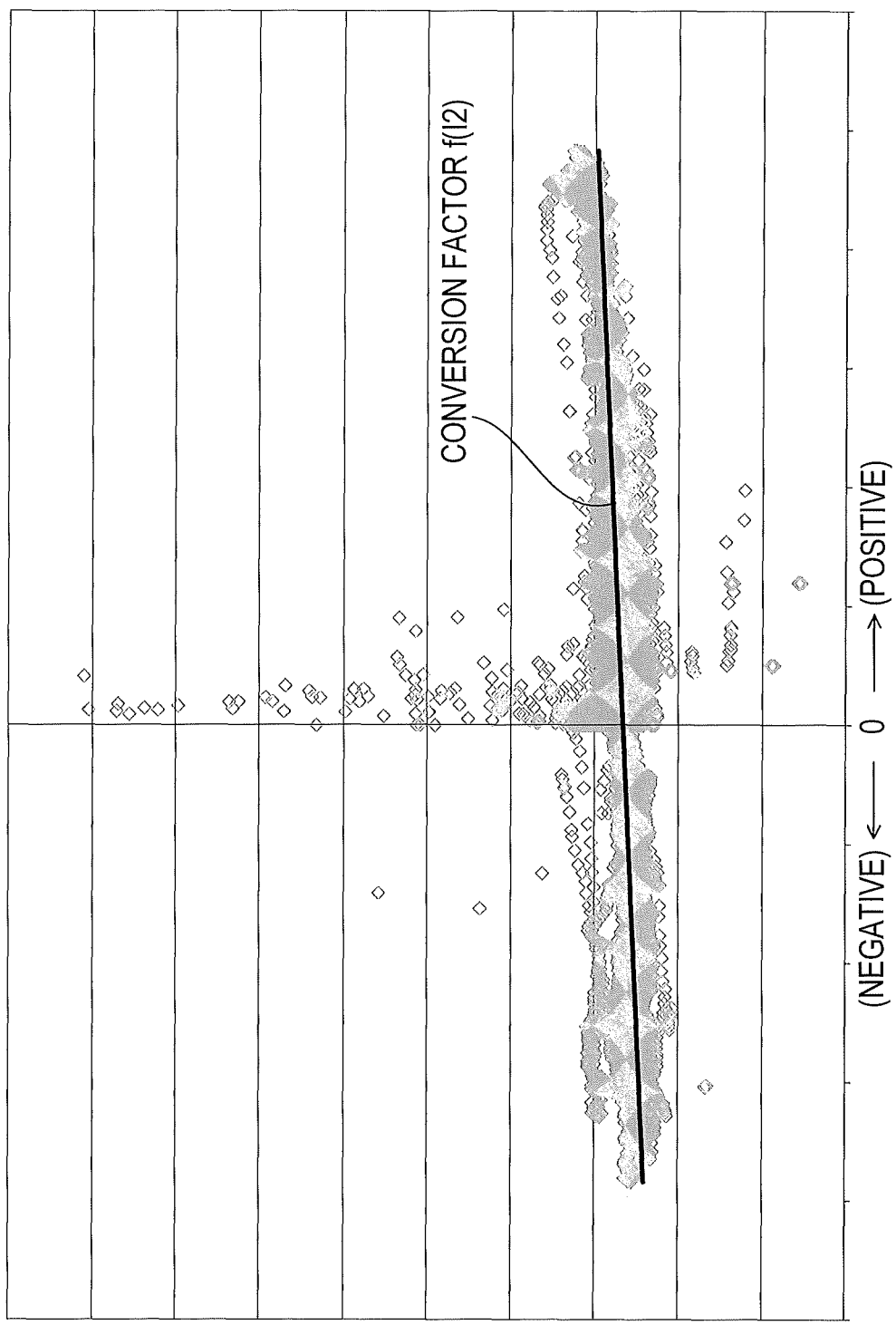
FIG. 2 is an explanatory diagram illustrating a method to derive a conversion factor f according to the embodiment.

One example of the result of the actual measurement and recording of the aforementioned values V1(x), V3(x), I2(x) performed as described above is shown in FIG. 2. FIG. 2 shows the result of the actual measurement at every different point x plotted on two-dimensional coordinates. In FIG. 2, the horizontal axis indicates I2, and the vertical axis indicates the V1/V3 ratio. The values of vertical axis are all positive values in the range of the vertical axis directly shown in FIG. 2.

As a result of a detailed data analysis, it was found out that, in a traveling section in which the secondary current value I2(x) continuously and largely fluctuates, a delay occurs until the tertiary voltage value V3(x) accords with the secondary current value I2(x) because of the L component of the main transformer 12. Thus, the data obtained from the actual measurement in the traveling section in which the secondary current value I2(x) largely fluctuates is not plotted on the coordinates shown in FIG. 2.

As clear from FIG. 2, it was recursively found out from the result of the actual measurement of the aforementioned values V1(x), V3(x), I2(x) that the V1/V3 ratio and the secondary current value I2 were correlated. It was also found out that the correlation was approximately linear (has a linear relation), and thus the relation between the secondary current value I2 and the V1/V3 ratio could be represented in a linear function by linear approximation.

Based on the distribution shown in FIG. 2, a linear function indicating the relation between the secondary current value I2 and the V1/V3 ratio, that is, the conversion factor f(I2) of the aforementioned formula (2), was derived by various methods such as the least squares method and the maximum likelihood method. The conversion factor f(I2) derived here is represented by a linear function in which, as shown in FIG. 2 as an example, the V1/V3 ratio linearly increases with the secondary current value I2. The derived conversion factor f(I2) was prestored in the storage 42 of the railroad vehicle 10 so that the power conversion control device 35 can estimate (calculate) the primary voltage value V1(x) using the conversion factor f(I2) based on the aforementioned formula (3) while the railroad vehicle 10 is traveling (for example, during commercial operation).

It was found out, from the result of a comparison between the primary voltage value V1(x) calculated with the conversion factor f(I2) based on the aforementioned formula (3) and the primary voltage value V1(x) that was actually measured, that the difference between the both values was small. In other words, the primary voltage value V1(x) calculated with the conversion factor f(I2) by the aforementioned formula (3) was confirmed to be highly accurate.

Although the conversion factor f(I2) is constant irrespective of the point x in the present embodiment, a conversion factor f(I2) that varies at every point x may be used. Specifically, for example, while the railroad vehicle 10 repeatedly reciprocatingly travel the traveling section where the actual measurement is performed, the primary voltage values V1 and the tertiary voltage values V3 relative to varying secondary current values I2(x) for the same single point x may be actually measured. The result of the actual measurement at every point x may be plotted as shown in FIG. 2 so as to derive and store conversion factors f(x, I2) for corresponding points x.

Moreover, for example, for each specified traveling section a conversion factor f(section, I2) for the corresponding traveling section may be individually derived and stored.

Furthermore, the conversion factors f(I2) for different traveling conditions may be separately provided. For example, different conversion factors f(v, I2) may be used according to the traveling velocity v. Moreover, different conversion factors f(rs, x) according to the gradient rs of the track, for example, may be used.

(1-3) Voltage and Power Calculation Process

Figure 3:
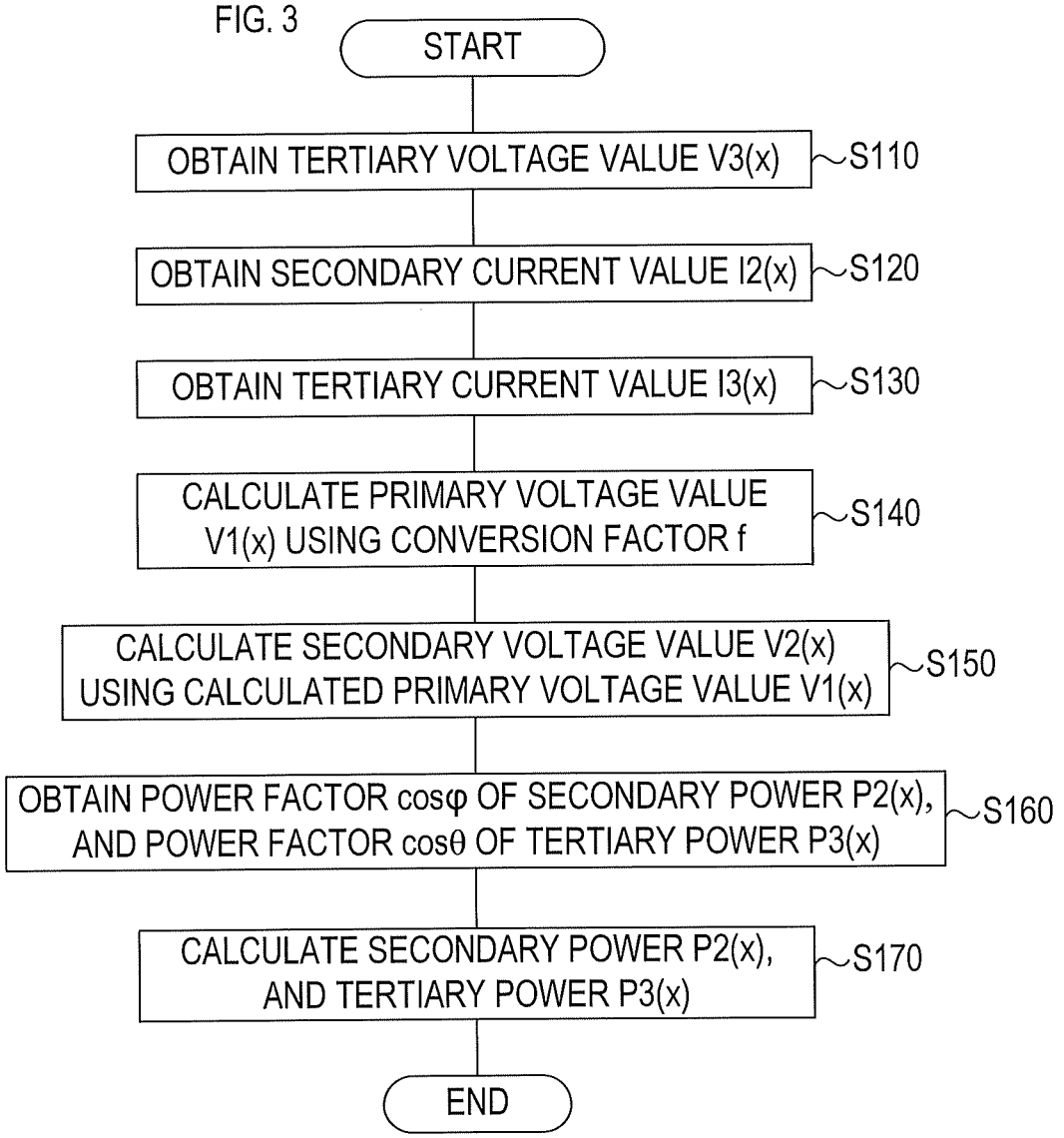
FIG. 3 is a flowchart illustrating a voltage and power calculation process according to the embodiment.

The following describes the voltage and power calculation process performed by the power conversion control device 35 while the railroad vehicle 10 is traveling with reference to FIG. 3. In response to the booting of the controller 41, the controller 41 periodically executes the voltage and power calculation process shown in FIG. 3. Based on the values calculated in the voltage and power calculation process, various control processes including a process to control the converter 31 are performed.

When the voltage and power calculation process is initiated, in S110, the controller 41 obtains the tertiary voltage value V3(x) based on the tertiary voltage detection signal. While executing the voltage and power calculation process, the controller 41 obtains the positon of the railroad vehicle 10 (point x) based on the position detection signal from the position detector 18, for example, in a periodical manner.

In S120, the secondary current value I2(x) is obtained based on the secondary current detection signal. In S130, the tertiary current value I3(x) is obtained based on the tertiary current detection signal.

In S140, using the conversion factor f(I2) prestored in the storage 42, the primary voltage value V1(x) is calculated based on the aforementioned formula (3).

In S150, the secondary voltage value V2(x) is calculated using the primary voltage value V1(x) calculated in S140. The secondary voltage value V2(x) may be calculated using the ratio of the winding turns N2 of the secondary winding 12b (hereinafter referred to as a "secondary winding turns N2") to the primary winding turns N1 (that is, N2/N1) based on the following formula (4).

$$V2(x)=V1(x)\cdot N2/N1 \tag{4}$$

In S160, a power factor cos φ of secondary power P2(x) (hereinafter referred to as a "secondary-side power factor comp") and a power factor cos θ of tertiary power P3(x) (hereinafter referred to as a "tertiary-side power factor cos θ") are obtained. The secondary power P2(x) is the power consumption of the secondary load. The tertiary power P3(x) is the power consumption of the tertiary load 20.

The secondary-side power factor cow may be preset according to the control method of the converter 31. For example, in a case where the control method of the converter 31 is the unity power factor control, the secondary-side power factor cos φ may be set to, for example, one or a value very close to one. In a case where the control method of the converter 31 is the leading power factor control, the secondary-side power factor cos φ according to the amount of phase lead in the leading power factor control may be preset. The tertiary-side power factor cos θ may be obtained, for example, based on a difference in phase between the tertiary voltage value V3(x) and the tertiary current value I3(x).

In S170, the secondary power P2(x) and the tertiary power P3(x) are calculated and individually stored in the storage 42. In other words, every time when the voltage and power calculation process is periodically performed, the secondary power P2(x) and the tertiary power P3(x) at the point x at which the voltage and power calculation process is executed are calculated and stored.

Specifically, the secondary power P2(x) and the tertiary power P3(x) may be respectively calculated by formula (5) and formula (6) shown below.

$$P2(x)=V2(x)\cdot I2(x)\cdot \cos \varphi \tag{5}$$

$$P3(x)=V3(x)\cdot I3(x)\cdot \cos \theta \tag{6}$$

Storing the secondary power P2(x) and the tertiary power P3(x) at every point x in the storage 42 as described above enables various controls, power management, power analysis, and so on using the power P2(x), P3(x) to be performed while the railroad vehicle 10 is traveling and after the railroad vehicle 10 finishes traveling.

(1-4) Effect of Embodiment

The embodiment described above achieves the following effect (1a) to (1e).

(1a) In the power conversion control device 35 according to the present embodiment, the correlation information indicating the correlation between the V1/V3 ratio and the secondary current value I2 is prestored in the storage 42. The power conversion control device 35 detects the tertiary voltage value V3 and the secondary current value I2 and estimates the primary voltage value V1 based on each of the detected values and the aforementioned correlation information.

Accordingly, even if the tertiary voltage value V3 changes due to a regulation phenomenon attributed from changes in the secondary current value I2, the primary voltage value V1 with high accuracy can be derived according to the detected secondary current value I2 and the tertiary voltage value V3 based on the aforementioned correlation information.

With the power conversion control device 35 according to the present embodiment, the primary voltage value V1 can be highly accurately estimated from the detection result of the tertiary voltage value V3 and the secondary current value I2 without installing measurement instruments and the like in the railroad vehicle 10 for actually measuring the primary voltage value V1. In other words, while inhibiting an increase in cost and size of the railroad vehicle 10, the primary voltage value V1 with high accuracy can be estimated.

(1b) Since the primary voltage value V1 can be highly accurately estimated with the power conversion control device 35 according to the present embodiment, the converter 31 can be accurately controlled using the primary voltage value V1 with high accuracy.

(1c) The correlation information according to the present embodiment includes a linear function indicating the relation between the secondary current value I2 and the V1/V3 ratio, that is, the conversion factor f(I2) of the aforementioned formula (2). Thus, the power conversion control device 35 can easily estimate the primary voltage value V1 with high accuracy from the detection result of the tertiary voltage value V3 and the secondary current value I2.

(1d) The conversion factor f(I2) according to the present embodiment cannot be derived by theoretical calculation. The conversion factor f(I2) according to the present embodiment is derived by linearly approximating the relation between the V1/V3 ratio and the secondary current value I2 based on the primary voltage value V1, the tertiary voltage value V3, and the secondary current value I2 that are all actually measured while the vehicle is traveling. Calculating the primary voltage value V1 using the conversion factor f(I2) derived based on the actually measured data allows more highly accurate estimation of the primary voltage value V1.

(1e) While the vehicle is traveling and the primary voltage value V1, the tertiary voltage value V3, and secondary current value I2 are actually measured so as derive the conversion factor f(I2), the state of the tertiary load is maintained constant. Accordingly, reduction in accuracy of the conversion factor f(I2) attributed from fluctuations in the tertiary load is inhibited, and the conversion factor f(I2) in which the correlation between the V1/V3 ratio and the secondary current value I2 is properly reflected can be derived.

The vehicle body 80 and the railroad trucks 81, 91 correspond to one example of the assembly according to the present disclosure. The main transformer 12 corresponds to one example of the transformer according to the present disclosure. The main converter 13 corresponds to one example of the power converter according to the present disclosure. The power conversion control device 35 corresponds to one example of the voltage estimating device for a power supply line according to the present disclosure. The conversion factor f(I2) corresponds to one example of the correlation information according to the present disclosure. The controller 41 corresponds to one example of the voltage calculator, the secondary voltage calculator, and the secondary power calculator according to the present disclosure. The V1/V3 ratio corresponds to one example of the voltage ratio according to the present disclosure. The secondary current corresponds to one example of the output current according to the present disclosure.

2. Other Embodiments

The embodiment of the present disclosure has been described above. However, the present disclosure is not limited to the above-described embodiment and may be carried out in various forms.

(2-1) The conversion factor f(I2) may be a function different from a linear function. The conversion factor f(I2) may be other function in which the relation between the V1/V3 ratio and the secondary current value I2 are properly represented.

The correlation information does not have to include the formulated conversion factor f(I2). The correlation information may include, for example, a database in which the relation between the secondary current value I2 and the V1/V3 ratio is expanded in a matrix form. The power conversion control device 35 may derive the primary voltage value V1 using the database.

(2-2) The tertiary voltage detector 16, the tertiary current detector 17, and the secondary current detector 36 may be arranged in positions different from the positions shown in FIG. 1. The tertiary voltage value V3, the secondary current value I2, and the tertiary current value I3 may be detected by any method.

(2-3) The power converter according to the present disclosure may be different from the main converter 13 shown in FIG. 1. The power converter according to the present disclosure may be configured, for example, without an inverter and may be configured to drive a direct-current motor by direct-current voltage from a converter.

(2-4) The railroad vehicle may comprise a secondary load that is different from the main converter 13 and the motor 14. The secondary load may comprise a plurality of the main converters 13 or a plurality of the motors 14.

(2-5) The factor of the regulation phenomenon that causes the fluctuations in the tertiary voltage value V3 is not limited to the fluctuations in the secondary load (that is, the fluctuations in the secondary current value I2). For example, if the tertiary load fluctuates, the tertiary current value I3 may fluctuate. The regulation phenomenon is also caused by the fluctuations in the tertiary current value I3.

Accordingly, the correlation information may be the correlation between the V1/V3 ratio, the secondary current value I2, and the tertiary current value I3. That is, this correlation may be derived in advance, and based on this correlation and using the tertiary current value I3, the primary voltage value V1 may be estimated.

The following describes the outline of a specific method for estimating the primary voltage value V1 in which the correlation between the V1/V3 ratio, the secondary current value I2, and the tertiary current value I3 is used.

As a result of various analyses, the inventors of the subject application have found out that the V1/V3 ratio is correlated not only to the secondary current value I2, but also to the tertiary current value I3. Specifically, they have found out that the V1/V3 ratio can be represented by a function wherein the tertiary current value I3 is a variable, and that the function can be approximated with a linear function.

That is, the relation between the V1/V3 ratio and the tertiary current value I3 can be represented by the following formulas (7) and (8).

$$V1(x)/V3(x)=f3(I3) \tag{7}$$

$$f3(I3)=C \cdot I3(x)+D \tag{8}$$

C and D are constants (for example, specified real numbers). To distinguish f(I2) shown in the aforementioned formulas (1) and (2) from f3(I3) described above, f(I2) will be referred to as "f2(I2)" here.

F3(I3) may be derived based on the primary voltage value V1 and the tertiary voltage value V3 actually measured. When the primary voltage value V1 and the tertiary voltage value V3 are actually measured, the tertiary current value I3 may be fluctuated by intentionally changing the tertiary load, while the secondary load is maintained constant. While changing the tertiary current value I3, the primary voltage value V1 and the tertiary voltage value V3 may be actually measured. The primary voltage value V1 and the tertiary voltage value V3 actually measured can be plotted in the same manner as in the method to derive f2(I2) on two-dimensional coordinates wherein the horizontal axis corresponds to I3, and the vertical axis corresponds to the V1/V3 ratio.

Based on the distribution of the dots plotted on the two-dimensional coordinates, it is recursively found out that the V1/V3 ratio and the tertiary current value I3 are also correlated. It is found out that this correlation is also approximately linear, and thus the relation between the tertiary current value I3 and the V1/V3 ratio can be represented as a linear function by linear approximation. Accordingly, a linear function representing the relation between the tertiary current value I3 and the V1/V3 ratio, that is, f3(I3) represented in the aforementioned formula (8) can be derived by various methods such as least squares method, method of maximum likelihood, and so on.

In a case where the V1/V3 ratio is represented as a function of the secondary current value I2 and the tertiary current value I3, the V1/V3 ratio may be represented as follows. That is, f2(I2) is normalized to f2'(I2) using a formula "f2'(I2)=f2(I2)/B", and f3(I3) is normalized to f3' (I3) using a formula "f3'(I3)=f3(I3)/D". F2(I2) and f3(I3) may be respectively normalized such that the central values become approximately one. The primary voltage value V1(x) may be represented by the following formula (9) using f2'(I2) and f3'(I3).

$$V1(x)=V3(x)\cdot k\cdot f2'(I2)\cdot f3'(I3) \qquad (9)$$

(k is a constant.)

The correlation between the V1/V3 ratio, the secondary current value I2, and the tertiary current value I3 may be represented in three-dimensional space coordinates consisting of an axis for the V1/V3 ratio, an axis for the secondary current value I2, and an axis for the tertiary current value I3. The deriving formula of V1(x) represented in the aforementioned formula (9) can be obtained by plotting the aforementioned correlation on three-dimensional space coordinates and, for example, linearly approximating the plotted result.

It can be said that f2(I2) represented by the aforementioned formula (2) is, in other words, obtained by converting the three-dimensional space coordinates, in which the aforementioned correlation is plotted, into two-dimensional plane coordinates indicating the relation between the V1/V3 ratio and the secondary current value I2, and by deriving f2(I2) based on the two-dimensional plane coordinates. The conversion from three-dimensional space coordinates into two-dimensional plane coordinates may be, for example, performed by partial derivative of the result plotted on the three-dimensional space coordinates with respect to I2, or may be performed by, for example, projecting the result, plotted on the three-dimensional space coordinates, on a two-dimensional plane wherein I3 is a constant value. It can be also said that f3(I3) represented in the aforementioned formula (8) is obtained by converting the three-dimensional space coordinates, in which the aforementioned correlation is plotted, into two-dimensional plane coordinates representing the relation between the V1/V3 ratio and the tertiary current value I3 in the similar manner as f2(I2) and by deriving f3(I3) based on the two-dimensional plane coordinates.

The following additionally describes the accuracy of the primary voltage value V1 obtained based on formula (3) in the aforementioned embodiment. In contrast to the aforementioned formula (9) in which the secondary current value I2 and the tertiary current value I3 are both considered, it can be said that formula (3) shown in the aforementioned embodiment is a formula in which the influence of the tertiary current value I3 is ignored. However, even with formula (3) in which the influence of the tertiary current value I3 is not considered, the primary voltage value V1 with practically sufficient accuracy can be calculated. This is because the influence of the tertiary current value I3 is relatively much smaller than the influence of the secondary current value I2.

For example, in the case of a high-speed railroad (for example, a bullet train, Shinkansen, and so on), in comparison between a maximum value I2max of the secondary current value I2 and a maximum value I3max of the tertiary current value I3, the maximum value I2max is much larger than the maximum value I3max (that is, I2max>>I3max). Specifically, for example, I2max becomes a large current value in a level of several hundred amperes, whereas I3max becomes a relatively very small current value, for example, in a level of several ten amperes. The fluctuation range of the tertiary current value I3 is much smaller than the fluctuation range of the secondary current value I2. Specifically, the fluctuation range of the tertiary current value I3 is, for example, about 2 to 3% of the fluctuation range of the secondary current value I2.

In other words, the tertiary voltage value V3 may fluctuate due to the influence of both the secondary current value I2 and the tertiary current value I3. Yet, in comparison with the fluctuation caused by the influence by the secondary current value I2, the fluctuation caused by the influence by the tertiary current value I3 is much smaller. Thus, the primary voltage value V1 can be also accurately obtained by the aforementioned formula (3) wherein only the secondary current value I2, but not the tertiary current value I3, is considered.

Figure 4:
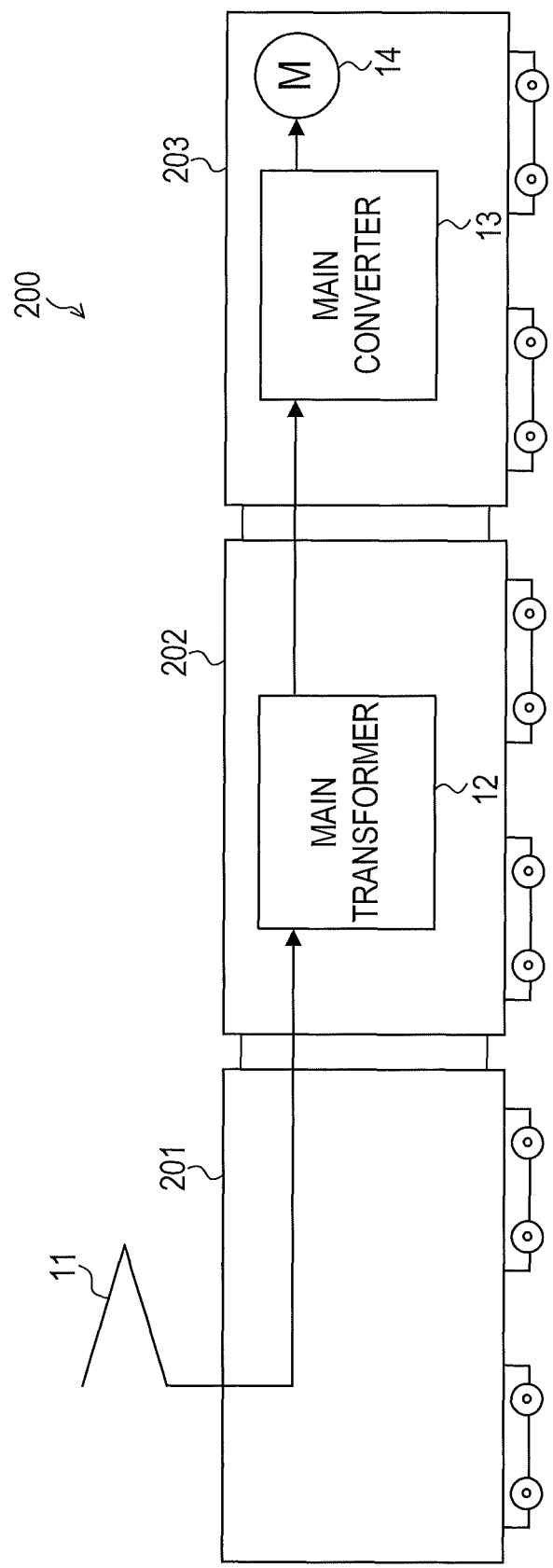
FIG. 4 is an explanatory diagram showing a configuration of a train according to the embodiment.

(2-6) The power conversion control device 35 may be installed in a train with multiple railroad vehicles. A train 200 shown in FIG. 4 comprises, for example, a first railroad vehicle 201, a second railroad vehicle 202, and a third railroad vehicle 203 coupled to one another.

The pantograph 11 may be disposed, for example, on the first railroad vehicle 201. The main transformer 12 may be disposed, for example, in the second railroad vehicle 202. The main converter 13 may be disposed, for example, in the third railroad vehicle 203.

In a train with multiple railroad vehicles, the pantograph 11, the main transformer 12, the main converter 13, and the motor 14 may be respectively provided to any of the railroad vehicles. For example, the pantograph 11, the main transformer 12, the main converter 13, and the motor 14 may be all disposed in the same railroad vehicle. Moreover, at least two, for example, of the pantograph 11, the main transformer 12, the main converter 13, and the motor 14 may be provided to the same railroad vehicle.

(2-7) Several functions possessed by a single component in the above-described embodiments may be achieved by several components; a single function possessed by a single component may be achieved by several components. Several functions possessed by several components may be achieved by a single component; a single function achieved by several components may be achieved by a single component. Some parts of the configurations of the above-described embodiments may be omitted. The component(s) possessed by any one of the above-described embodiments may be added to or altered with the component(s) of another embodiment.

What is claimed is:

1. A railroad vehicle comprising:
   an assembly comprising:
      a railroad truck configured to rotatably hold an axle; and
      a vehicle body provided to the railroad truck,
   a power converter provided to the assembly and configured to generate electric power that drives a motor based on output power from a transformer, the transformer comprising a primary winding, a secondary winding, and a tertiary winding, the primary winding being configured to receive alternating primary voltage from a power supply line, the secondary winding being electromagnetically coupled to the primary winding and configured to output the output power, the output power including secondary voltage that is lower than the primary voltage and output current, the tertiary winding being electromagnetically coupled to the primary winding and configured to output tertiary voltage that is lower than the secondary voltage, a voltage detector provided to the assembly and configured to detect a magnitude of the tertiary voltage, a current detector provided to the assembly and configured to detect a magnitude of the output current, a voltage calculator provided to the assembly and configured to calculate a magnitude of the primary voltage based on the magnitude of the tertiary voltage detected by the voltage detector, the magnitude of the output current detected by the current detector, and correlation information, the correlation information indicating a correlation between a voltage ratio and the magnitude of the output current, and the voltage ratio representing a ratio of the magnitude of the primary voltage to the magnitude of the tertiary voltage.

2. A voltage estimating device for a power supply line, the voltage estimating device comprising:

a voltage detector configured to detect a magnitude of specified voltage outputted from a transformer provided to a railroad vehicle, the transformer comprising a primary winding, a secondary winding, and a tertiary winding, the primary winding being configured to receive alternating primary voltage from a power supply line, the secondary winding being electromagnetically coupled to the primary winding and configured to output secondary voltage that is lower than the primary voltage and output current, the tertiary winding being electromagnetically coupled to the primary winding and configured to output tertiary voltage that is lower than the secondary voltage, the specified voltage corresponding to the tertiary voltage;

a current detector configured to detect a magnitude of the output current; and a voltage calculator configured to calculate a magnitude of the primary voltage based on the magnitude of the tertiary voltage detected by the voltage detector, the magnitude of the output current detected by the current detector, and correlation information, the correlation information indicating a correlation between a voltage ratio and the magnitude of the output current, and the voltage ratio representing a ratio of the magnitude of the primary voltage to the magnitude of the tertiary voltage.

3. The voltage estimating device for a power supply line according to claim 2, wherein the correlation information includes a linear function, wherein the linear function represents a linear relation between the voltage ratio and the magnitude of the output current, and wherein the voltage calculator is configured to calculate the magnitude of the primary voltage based on the linear function.

4. The voltage estimating device for a power supply line according to claim 3, wherein the linear relation is linearly approximated based on the magnitude of the primary voltage, the magnitude of the tertiary voltage, and the magnitude of the output current, and wherein the magnitude of the primary voltage, the magnitude of the tertiary voltage, and the magnitude of the output current are experimentally measured.

5. The voltage estimating device for a power supply line according to claim 4, wherein the tertiary voltage is inputted into a first load configured to operate by the tertiary voltage, and wherein the magnitude of the primary voltage, the magnitude of the tertiary voltage, and the magnitude of the output current are experimentally measured under a condition where a state of the first load is maintained constant.

6. The voltage estimating device for a power supply line according to claim 2 further comprising a secondary voltage calculator configured to calculate a magnitude of the secondary voltage from the magnitude of the primary voltage calculated by the voltage calculator based on a ratio of winding turns of the primary winding to winding turns of the secondary winding.

7. The voltage estimating device for a power supply line according to claim 6, wherein the secondary voltage is inputted into a second load configured by the secondary voltage, and wherein the voltage estimating device for a power supply line further comprises a power calculator configured to calculate power consumption by the second load based on the magnitude of the secondary voltage calculated by the secondary voltage calculator and the magnitude of the output current detected by the current detector.

8. The voltage estimating device for a power supply line according to claim 2, wherein the voltage estimating device for a power supply line is configured to be installed in a railroad vehicle.

9. The voltage estimating device for a power supply line according to claim 2, wherein the voltage estimating device for a power supply line is configured to be installed in a train comprising at least one railroad vehicle, and wherein the train comprises the transformer.

10. The voltage estimating device for a power supply line according to claim 9, wherein the voltage estimating device for a power supply line is configured to be installed in a power converter, wherein the power converter is configured to be installed in the train, and, upon receiving output power including the secondary voltage and the output current from the transformer, to generate, from the output power, electric power that drives a motor based on the magnitude of the primary voltage calculated by the voltage calculator, and wherein the motor is configured to generate driving force that operates the train.

11. The voltage estimating device for a power supply line according to claim 2 further comprising a storage that stores the correlation information, wherein the voltage calculator is configured to calculate a magnitude of the primary voltage based on the correlation information stored in the storage.

12. A method for estimating voltage in a power supply line, the method comprising:

detecting a magnitude of specified voltage outputted from a transformer provided to a railroad vehicle, the transformer comprising a primary winding, a secondary winding, and a tertiary winding, the primary winding being configured to receive alternating primary voltage from a power supply line, the secondary winding being electromagnetically coupled to the primary winding and configured to output secondary voltage that is lower than the primary voltage and output current, the tertiary winding being electromagnetically coupled to the primary winding and configured to output tertiary voltage that is lower than the secondary voltage, and the specified voltage corresponding to the tertiary voltage, detecting a magnitude of the output current, and calculating a magnitude of the primary voltage based on the magnitude of the tertiary voltage detected, the magnitude of the output current detected, and correlation information, the correlation information indicating a correlation between a voltage ratio and the magnitude of the output current, the voltage ratio representing a ratio of the magnitude of the primary voltage to the magnitude of the tertiary voltage.

* * * * *